United States Patent
Kimura et al.

(10) Patent No.: US 8,594,596 B2
(45) Date of Patent: Nov. 26, 2013

(54) AMPLIFIER

(71) Applicant: Fujitsu Limited, Kawasaki (JP)

(72) Inventors: Shigekazu Kimura, Yokohama (JP); Toru Maniwa, Setagaya (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/659,087

(22) Filed: Oct. 24, 2012

(65) Prior Publication Data

US 2013/0149979 A1 Jun. 13, 2013

(30) Foreign Application Priority Data

Dec. 7, 2011 (JP) ................................. 2011-267539

(51) Int. Cl.
*H01Q 11/12* (2006.01)
*H04M 1/00* (2006.01)

(52) U.S. Cl.
USPC .................. 455/127.2; 455/127.4; 455/552.1; 330/124 R (58) Field of Classification Search
USPC ............. 455/107, 127.2, 127.3, 127.4, 552.1, 455/553.1, 561; 330/124 R, 126
See application file for complete search history.

(56) References Cited

U.S. PATENT DOCUMENTS

| | | | |
|---|---|---|---|
| 6,861,907 B2 * | 3/2005 | Gotou | 330/295 |
| 7,427,895 B1 * | 9/2008 | Okubo et al. | 330/124 R |
| 7,489,910 B2 * | 2/2009 | Kato et al. | 455/127.2 |
| 7,589,589 B2 * | 9/2009 | Kusunoki | 330/124 R |

FOREIGN PATENT DOCUMENTS

JP 2006-345341 12/2006

* cited by examiner

*Primary Examiner* — Quochien B Vuong
(74) *Attorney, Agent, or Firm* — Katten Muchin Rosenman LLP (57) ABSTRACT

An amplifier includes a first amplification element configured to amplify a first signal in one of first and second operation classes, a second amplification element configured to amplify a second signal in one of first and second operation classes, a first transmission line through which the amplified first signal is transferred, and a coupler configured to couple the transferred first signal and the amplified second signal, wherein the first amplification element amplifies the first signal in the first operation class and the second amplification element amplifies the second signal in the second operation class, when the first signal and the second signal have a first frequency band, and wherein the first amplification element amplifies the first signal in the second operation class and the second amplification element amplifies the second signal in the first operation class, when the first signal and the second signal have a second frequency band.

12 Claims, 9 Drawing Sheets

FIG. 10

AMPLIFIER

CROSS-REFERENCE TO RELATED APPLICATION

This application is based upon and claims the benefit of priority of the prior Japanese Patent Application No. 2011-267539, filed on Dec. 7, 2011, the entire contents of which are incorporated herein by reference.

FIELD

The embodiments discussed herein are related to an amplifier.

BACKGROUND

The number of frequency bands utilized in a mobile communication system has been increased. Recently, in the mobile communication system, a service is provided in multiple bands (multiband). More specifically, the service is provided in a 700 MHz band, an 800 MHz band, a 1.5 GHz band, a 1.7 GHz band, a 2.1 GHz band, and a 2.5 GHz band in the mobile communication system.

An amplifier used for a base station in the mobile communication system is requested to have a high efficiency performance. To satisfy the request of the high efficiency performance, the Doherty amplifier is adopted in many cases. The Doherty amplifier includes a carrier-amplifier and a peak-amplifier arranged in parallel. The carrier-amplifier regularly operates, and the peak-amplifier operates only at the time of a high output.

In the base station, an amplifier is prepared for each frequency band. However, the preparation of the amplifier for each frequency band is not preferable from viewpoints of a design, a cost, and an amount of resources. Therefore, a Doherty amplifier that can cope with the multiband by a single amplifier is desired.

A technique for achieving the high efficiency performance with respect to the multiband by switching, using a switch, an electrical length of an output power combining circuit of the Doherty amplifier in accordance with the frequency band is proposed (for example, see Japanese Laid-open Patent Publication No. 2006-345341).

SUMMARY

According to an aspect of the invention, an amplifier includes a first amplification element configured to amplify a first signal in one of a first operation class and a second operation class, a second amplification element configured to amplify a second signal in one of a first operation class and a second operation class, a first transmission line through which the amplified first signal is transferred, and a coupler configured to couple the first signal transferred through the first transmission line and the amplified second signal so as to transfer the coupled signal to a second transmission line, wherein the first amplification element amplifies the first signal in the first operation class and the second amplification element amplifies the second signal in the second operation class, when the first signal and the second signal have a first frequency band, and wherein the first amplification element amplifies the first signal in the second operation class and the second amplification element amplifies the second signal in the first operation class, when the first signal and the second signal have a second frequency band.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments will be described based on the drawings. In all the drawings for describing the embodiments, the same reference sign is used for elements having the same function, and a repeated description thereof will be omitted.

First Embodiment

<Base Station 100>

Figure 1:
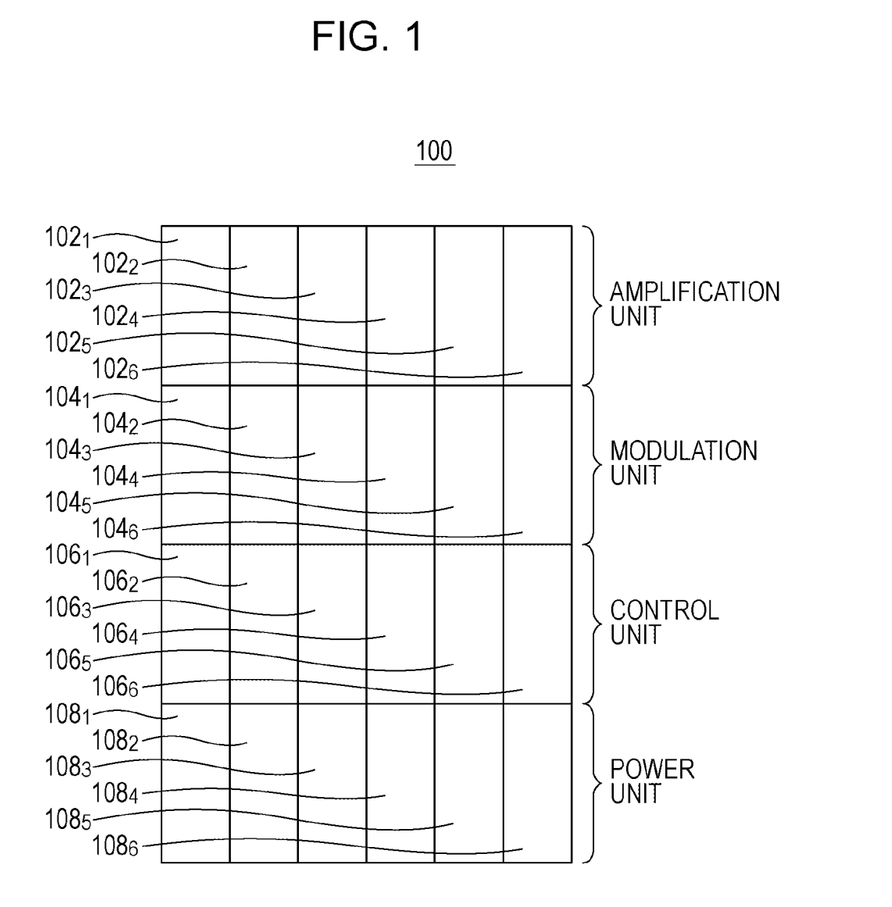
FIG. 1 illustrates a base station according to a first embodiment.

FIG. 1 illustrates a base station 100 according to an embodiment. The base station 100 includes amplification units 102 ($102_1$ to $102_6$), modulation units 104 ($104_1$ to $104_6$), control units 106 ($106_1$ to $106_6$), and power units 108 ($108_1$ to $108_6$). A base station may be configured by including units represented by the same suffix.

FIG. 1 illustrates a case in which the base station 100 includes six amplification units $102_1$ to $102_6$. However, the number of the amplification units 102 is not limited to six, and one or two to five amplification units, or seven or more amplification units may be included. FIG. 1 illustrates a case in which the base station 100 includes six modulation units $104_1$ to $104_6$. However, the number of the modulation units 104 is not limited to six, and one or two to five modulation units, or seven or more modulation units may be included. FIG. 1 illustrates a case in which the base station 100 includes six control units $106_1$ to $106_6$. However, the number of the control units 106 is not limited to six, and one or two to five control units, or seven or more control units may be included. FIG. 1 illustrates a case in which the base station 100 includes six power units $108_1$ to $108_6$. However, the number of the power units 108 is not limited to six, and one or two to five power units, or seven or more power units may be included.

For example, the amplification units $102_1$ to $102_6$, the modulation units $104_1$ to $104_6$, the control units $106_1$ to $106_6$, and the power units $108_1$ to $108_6$ may have a card-like shape. The base station is configured by storing the respective units in a casing of the base station.

<Base Station 200>

Figure 2:
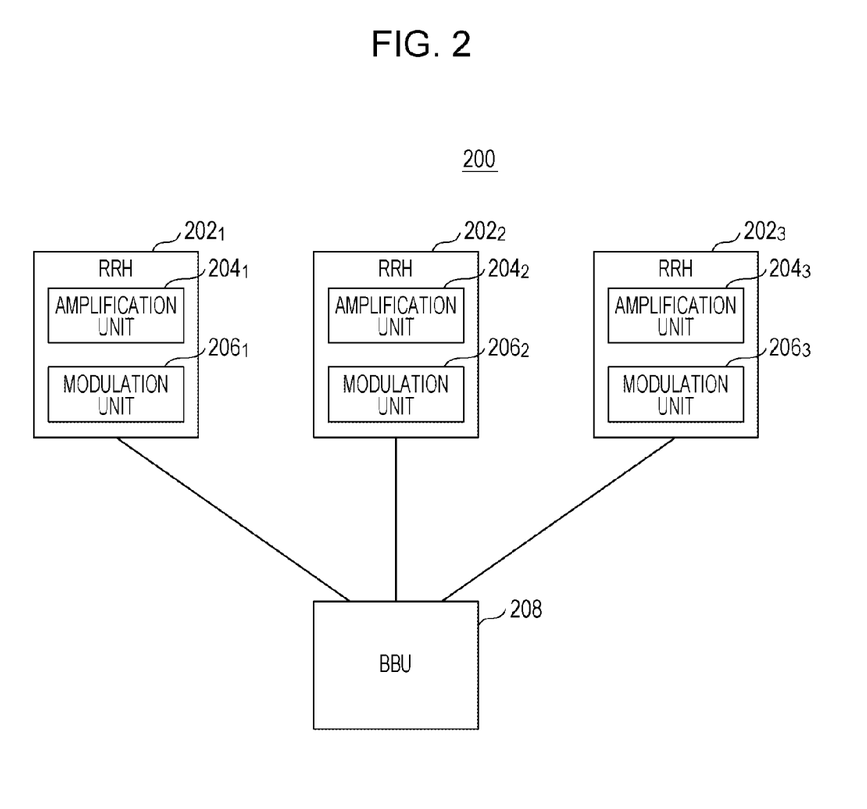
FIG. 2 illustrates another base station according to the first embodiment.

FIG. 2 illustrates a base station 200 according to the embodiment. The base station 200 includes Remote Radio Heads (RRHs) 202 ($202_1$ to $202_3$) and a Base Band Unit (BBU) 208. FIG. 2 illustrates a case in which the base station 200 includes three RRHs $202_1$ to $202_3$. The number of the RRH 202 is not limited to three, and one or two, or four or more remote radio heads may be included.

The RRH 202 is a wireless unit of the base station. More specifically, the RRH 202 includes modulation units 206 ($206_1$ to $206_3$) configured to perform modulation processing on transmission data. The RRH 202 also includes amplification units 204 ($204_1$ to $204_3$) configured to amplify a signal on which the modulation processing is performed by the modulation unit 206. The BBU 208 is configured to perform base band signal processing.

<Transmission Unit 300>

Figure 3:
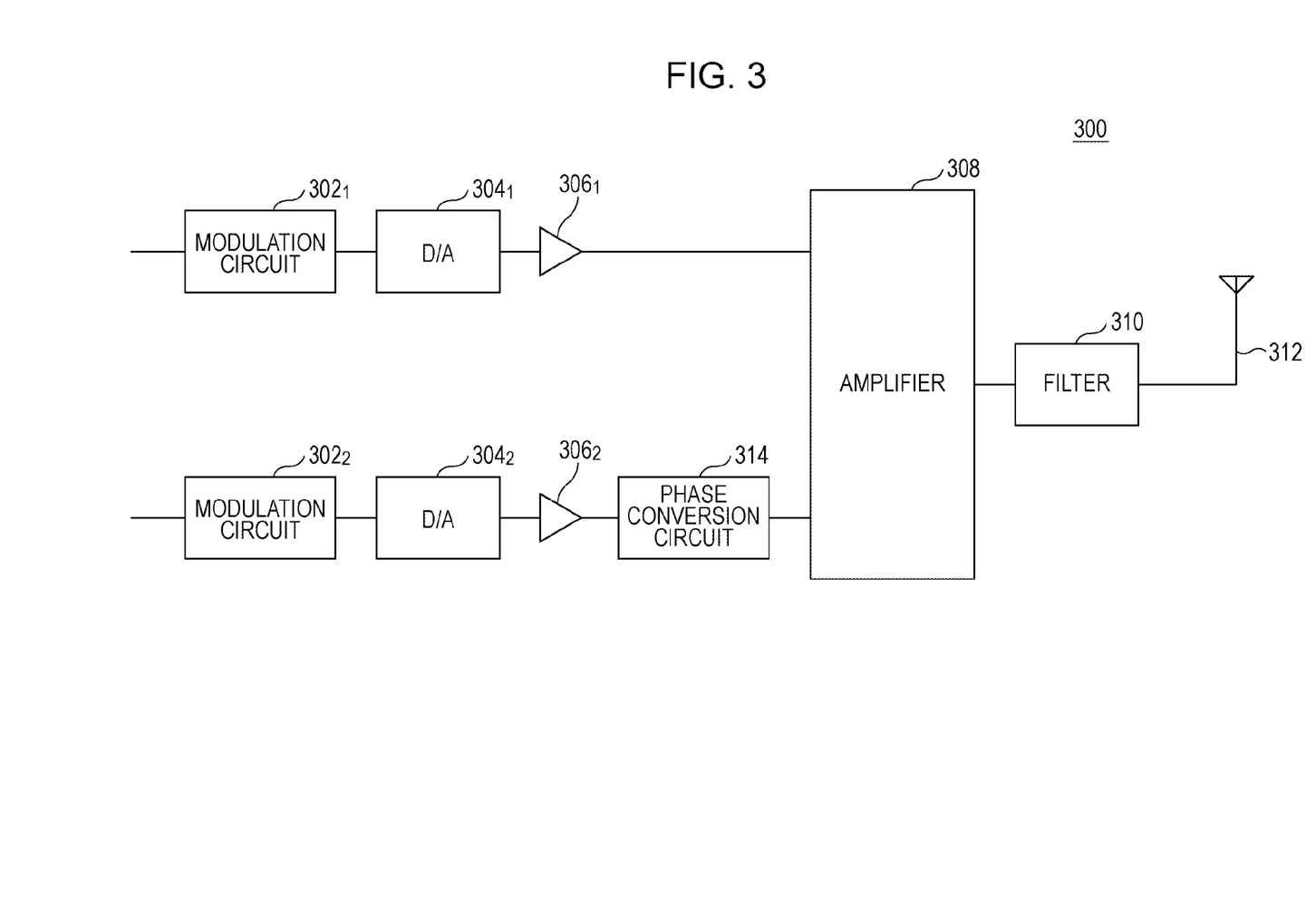
FIG. 3 illustrates a transmission unit according to the first embodiment.

FIG. 3 illustrates a transmission unit 300 according to the embodiment. The transmission unit 300 may be mainly included in the amplification unit 102, the modulation unit 104 in the base station 100 illustrated in FIG. 1 and the RRH 202 in the base station 200 illustrated in FIG. 2.

The transmission unit 300 includes modulation circuits $302_1$ and $302_2$, digital-to-analog (D/A) converters $304_1$ and $304_2$, preamplifiers $306_1$ and $306_2$, an amplifier 308, a filter 310, an antenna 312, and a phase conversion circuit 314. The amplifier 308 is achieved by the Doherty amplifier.

The modulation circuits $302_1$ and $302_2$ are configured to modulate the transmission signal. The modulation circuit $302_1$ sends out the modulated transmission signal to the D/A converter $304_1$. The modulation circuit $302_2$ sends out the modulated transmission signal to the D/A converter $304_2$.

The D/A converters $304_1$ and $304_2$ are respectively connected to the modulation circuits $302_1$ and $302_2$. The D/A converters $304_1$ and $304_2$ convert the modulated transmission signal from a digital signal to an analog signal. The D/A converter $304_1$ sends out the signal converted into the analog signal to the preamplifier $306_1$. The D/A converter $304_2$ sends out the signal converted into the analog signal to the preamplifier $306_2$.

The preamplifiers $306_1$ and $306_2$ are respectively connected to the D/A converters $304_1$ and $304_2$. The preamplifiers $306_1$ and $306_2$ amplify the analog signals from the D/A converters $304_1$ and $304_2$. The preamplifier $306_1$ sends out the amplified analog signal to the amplifier 308. The preamplifier $306_2$ sends out the amplified analog signal to the phase conversion circuit 314.

The phase conversion circuit 314 is connected to the preamplifier $306_2$. The phase conversion circuit 314 shifts a phase of the signal from the preamplifier $306_2$ by 90 degrees. The phase conversion circuit 314 sends out the signal from the preamplifier $306_2$ the phase of which is shifted by 90 degrees to the amplifier 308. Specifically, the phase conversion circuit 314 delays the phase of the signal from the preamplifier $306_2$ by 90 degrees. The phase of the signal from the preamplifier $306_2$ is delayed by 90 degrees because the signal from a carrier-amplifier and the signal from a peak-amplifier are coupled to each other at a phase difference by 90 degrees in the Doherty amplifier.

The amplifier 308 is connected to the preamplifier $306_1$ and the phase conversion circuit 314. The amplifier 308 utilizes the signal from the preamplifier $306_1$ and the signal from the phase conversion circuit 314 to amplify the power up to an average power level by the carrier-amplifier and operate the peak-amplifier from a point in the middle of the power elevation. The amplifier 308 synthesizes the signal amplified by the carrier-amplifier with the signal amplified by the peak-amplifier. With the amplification by the carrier-amplifier, it is possible to improve the amplification efficiency. With the operation by the peak-amplifier, it is also possible to obtain the maximum power. The amplifier 308 sends out the amplified signal obtained by utilizing the signal from the preamplifier $306_1$ and the signal from the phase conversion circuit 314 to the filter 310.

The filter 310 is connected to the amplifier 308. The filter 310 performs a band limitation on the signal from the amplifier 308 and sends out the signal to the antenna 312.

The antenna 312 is connected to the filter 310. The antenna 312 wirelessly transmits the signal on which the filter 310 performs the band limitation.

<Amplifier 308>

Figure 4:
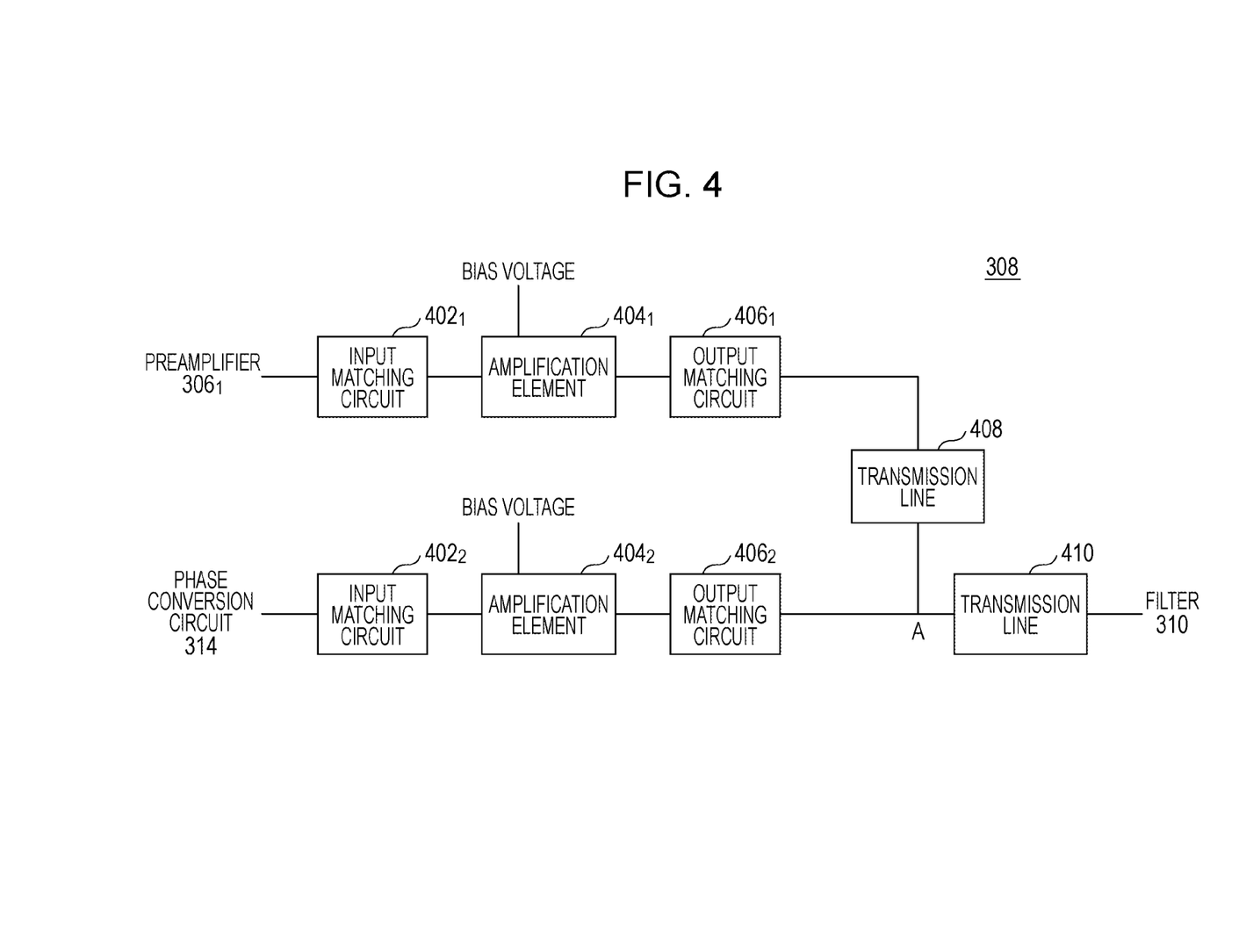
FIG. 4 illustrates an amplifier according to the first embodiment.

FIG. 4 illustrates the amplifier 308 according to the embodiment. The amplifier 308 operates corresponding to plural bands, that is, multiband. Specifically, the amplifier 308 operates corresponding to the 700 MHz band, the 800 MHz band, the 1.5 GHz band, the 1.7 GHz band, the 2.1 GHz band, and the 2.5 GHz band.

A case will be described in which the amplifier 308 according to the embodiment operates corresponding to the 700 MHz band and the 2.1 GHz band among the plural bands. The present embodiment can also similarly be applied to a case in which the amplifier 308 operates corresponding to other frequencies without a limitation on the case in which the amplifier 308 operates corresponding to 700 MHz band and the 2.1 GHz band.

The amplifier 308 includes input matching circuits $402_1$ and $402_2$, amplification elements $404_1$ and $404_2$, the output matching circuits $406_1$ and $406_2$, and transmission lines 408 and 410. For example, the amplification elements $404_1$ and $404_2$ may be a semiconductor device such as an LD-MOS (Lateral Double-Diffused MOS), a GaAs-FET, an HEMT, or an HBT.

In the amplifier 308, between a bias voltage operating in Class AB and a bias voltage operating in Class C, voltages applied to the amplification elements $404_1$ and $404_2$ are switched. More specifically, in a case where the input signal is a signal in the 700 MHz band, the bias voltage to operate in Class AB is applied to the amplification element $404_1$, and the bias voltage to operate in Class C is applied to the amplification element $404_2$. Since the amplification element $404_1$ receives the bias voltage to operate in Class AB, the amplification element $404_1$ functions as the carrier-amplifier of the Doherty amplifier. Since the amplification element $404_2$ receives the bias voltage to operate in Class C, the amplification element $404_2$ functions as the peak-amplifier of the Doherty amplifier. The input signals are the signals from the preamplifier $306_1$ and the phase conversion circuit 314.

Further, in a case where the input signal is a signal in the 2.1 GHz band, the bias voltage to operate in Class C is applied to the amplification element $404_1$, and the bias voltage to operate in Class AB is applied to the amplification element $404_2$. Since the amplification element $404_1$ receives the bias voltage to operate in Class C, the amplification element $404_1$ functions as the peak-amplifier of the Doherty amplifier. Since the amplification element $404_2$ receives the bias voltage to operate in Class AB, the amplification element $404_2$ functions as the carrier-amplifier.

By switching the bias voltages to be applied to the amplification elements $404_1$ and $404_2$, the amplification elements $404_1$ and $404_2$ can switch the functions between the function as the carrier-amplifier and the function as the peak-amplifier of the Doherty amplifier.

The input matching circuit $402_1$ is connected to the preamplifier $306_1$. The input matching circuit $402_1$ converts an impedance of the signal from the preamplifier 306₁ to be matched with an input impedance of the amplification element 404₁. The input matching circuit 402₁ sends out the impedance-converted signal to the amplification element 404₁.

The amplification element 404₁ is connected to the input matching circuit 402₁. The amplification element 404₁ is an amplification element configured to amplify the signal. The amplification element 404₁ is biased to Class AB or Class C. That is, the amplification element 404₁ receives, as the bias voltage, the voltage that is applied for operating the amplification element 404₁ in Class AB or the voltage that is applied for operating the amplification element 404₁ in Class C. Since the amplification element 404₁ receives the voltage to an extent where the operation class is changed, the amplification element 404₁ can be operated as the Class AB amplifier or the Class C amplifier. The amplification element 404₁ sends out the amplified signal to the output matching circuit 406₁.

The output matching circuit 406₁ is connected to the amplification element 404₁. The output matching circuit 406₁ including the transmission line 408 converts a load impedance of the signal from the amplification element 404₁.

The input matching circuit 402₂ is connected to the phase conversion circuit 314. The input matching circuit 402₂ converts the impedance of the signal from the phase conversion circuit 314 to be matched with the input impedance of the amplification element 404₂. The input matching circuit 402₂ sends out the impedance-converted signal to the amplification element 404₂.

The amplification element 404₂ is connected to the input matching circuit 402₂. The amplification element 404₂ is an amplification element configured to amplify the signal. The amplification element 404₂ is biased to Class AB or Class C. That is, the amplification element 404₂ receives, as the bias voltage, the voltage that is applied for operating the amplification element 404₂ in Class AB or the voltage that is applied for operating the amplification element 404₂ in Class C. Since the amplification element 404₂ receives the voltage to an extent where the operation class is changed, the amplification element 404₂ can be operated as the Class AB amplifier or the Class C amplifier. The amplification element 404₂ sends out the amplified signal to the output matching circuit 406₂.

The output matching circuit 406₂ is connected to the amplification element 404₂. The output matching circuit 406₂ converts a load impedance of the signal from the amplification element 404₂.

The transmission line 408 is connected to the output matching circuit 406₁. The transmission line 408 is a transmission line configured to carry out the impedance conversion of the signal from the output matching circuit 406₁. More specifically, in the transmission line 408, an impedance conversion is carried out based on an electrical length of λ/4 with respect to a frequency of the signal that is input to the amplifier 308. The signal input to the amplifier 308 is the signal from the preamplifier 306₁. Herein, the electrical length regulates the length of the transmission line while a wavelength (λ) in the transmission line is set as a reference. With the regulation while the wavelength in the transmission line is set as a reference, it is possible to take a line constant into account. The line constant includes a specific inductive capacity of a dielectric or the like. By carrying out the impedance conversion of the signal from the output matching circuit 406₁ based on the electrical length of λ/4 with respect to the frequency of the signal that is input to the amplifier 308, it is possible to ensure the matching with the signal from the output matching circuit 406₂.

The transmission line 410 is connected to the transmission line 408 and the output matching circuit 406₂. In the transmission line 410, the impedance conversion is carried out on the signal obtained by synthesizing the signal from the transmission line 408 with the signal from the output matching circuit 406₂. A point where the signal from the transmission line 408 is coupled to the signal from the output matching circuit 406₂ is set as a coupling part A. The signal from the transmission line 408 is synthesized with the signal from the output matching circuit 406₂ at the coupling part A. More specifically, in the transmission line 410, the impedance conversion is carried out based on the electrical length of λ/4 with respect to the frequency of the signal that is input to the amplifier 308. By carrying out the impedance conversion based on the electrical length of λ/4 with respect to the frequency of the signal that is input to the amplifier 308, it is possible to ensure the matching with the filter 310.

<Input Matching Circuits 402₁ and 402₂>

Under the condition for matching the impedance between the devices, an impedance point at which the efficiency is optimized may be different from an impedance point at which the electric power is maximized in some cases. Depending on the frequency of the input signal, also, an impedance point at which the efficiency is optimized may be different from an impedance point at which the electric power is maximized in some cases.

An amplifier that operates corresponding to plural frequency bands will be described. For example, the amplifier can be used for input signals in two frequency bands. In the above-mentioned amplifier, it may be difficult, in some cases, to obtain a matching circuit that can ensure the impedance matching so that the efficiency is optimized in both frequency bands of a frequency band f1 and a frequency band f2. Herein, the frequency band f1 may be the 700 MHz band, and the frequency band f2 may be the 2.1 GHz band. According to the present embodiment, the amplifier is designed so that the matching can be ensured to optimize the efficiency in the frequency band f1 and the matching can be ensured to maximize the electric power in the frequency band f2. The impedance matching point at which the efficiency is optimized may be different from the impedance matching point at which the electric power is maximized. In the amplifier 308, since the two types of impedance points can be selected, it is possible to increase the impedance points that can be selected at the time of designing.

Figure 5:
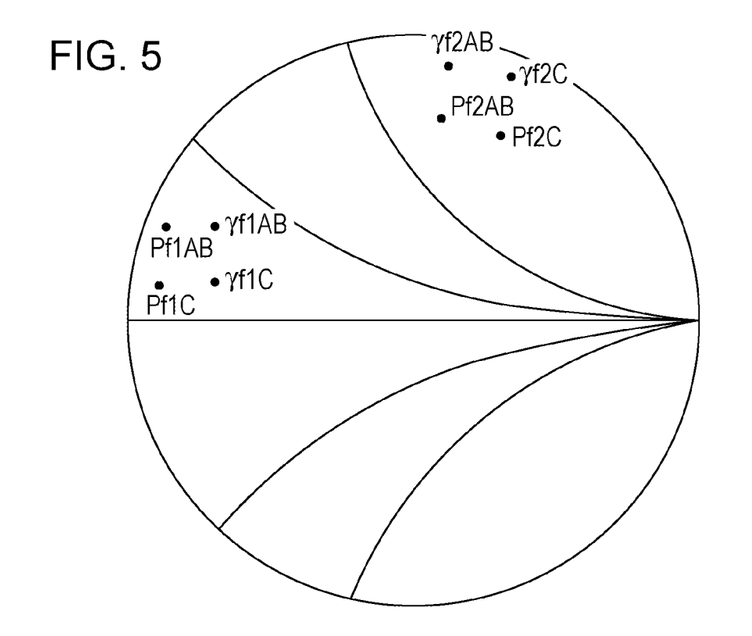
FIG. 5 is a Smith chart illustrating an example of an impedance matching by input matching circuits.

FIG. 5 is a Smith chart illustrating an example of an impedance matching by the input matching circuits 402₁ and 402₂.

In FIG. 5, "Pf1AB" is a point representing the impedance where the electric power is maximized when the input signal in the frequency band f1 is amplified by the amplification element that receives the bias voltage to operate in Class AB. "Pf1C" is a point representing the impedance where the electric power is maximized when the input signal in the frequency band f1 is amplified by the amplification element that receives the bias voltage to operate in Class C. "γf1AB" is a point representing the impedance where the efficiency is optimized when the input signal in the frequency band f1 is amplified by the amplification element that receives the bias voltage to operate in Class AB. "γf1C" is a point representing the impedance where the efficiency is optimized when the input signal in the frequency band f1 is amplified by the amplification element that receives the bias voltage to operate in Class C.

Further, "Pf2AB" is a point representing the impedance where the electric power is maximized when the input signal in the frequency band f2 is amplified by the amplification element that receives the bias voltage to operate in Class AB.

"Pf2C" is a point representing the impedance where the electric power is maximized when the input signal in the frequency band f2 is amplified by the amplification element that receives the bias voltage to operate in Class C. "γf2AB" is a point representing the impedance where the efficiency is optimized when the input signal in the frequency band f2 is amplified by the amplification element that receives the bias voltage to operate in Class AB. "γf2C" is a point representing the impedance where the efficiency is optimized when the input signal in the frequency band f2 is amplified by the amplification element that receives the bias voltage to operate in Class C.

In the example illustrated in FIG. 5, "Pf1AB" as the impedance matching point at which the electric power is maximized in the frequency band f1 or "γf1AB" as the impedance matching point at which the efficiency is optimized in the frequency band f1 can be set in the input matching circuit $402_1$. Furthermore, in accordance with the impedance matching point set in the input matching circuit $402_1$, it is possible to set the impedance matching point in the input matching circuit $402_2$. More specifically, "γf1C" as the impedance matching point at which the efficiency is optimized in the frequency band f1 or "Pf1C" as the impedance matching point at which the electric power is maximized in the frequency band f1 can be set in the input matching circuit $402_2$.

Further, "Pf2AB" as the impedance matching point at which the electric power is maximized in the frequency band f2 or "γf2AB" as the impedance matching point at which the efficiency is optimized in the frequency band f2 can be set in the input matching circuit $402_1$. Furthermore, in accordance with the impedance matching point set in the input matching circuit $402_1$, it is possible to set the impedance matching point in the input matching circuit $402_2$. More specifically, "γf2C" as the impedance matching point at which the efficiency is optimized in the frequency band f2 or "Pf2C" as the impedance matching point at which the electric power is maximized in the frequency band f2 can be set in the input matching circuit $402_2$. Accordingly, when the multiband of the amplifier is to be achieved, it is possible to improve the degree of freedom in the design of the matching circuit.

<Output Matching Circuits $406_1$ and $406_2$>

With regard to the output matching circuits $406_1$ and $406_2$, similarly as in the input matching circuits $402_1$ and $402_2$, under the condition for matching the impedance between the devices, an impedance point at which the efficiency is optimized may be different from an impedance point at which the electric power is maximized in some cases. Depending on the frequency of the input signal, also, an impedance point at which the efficiency is optimized is different from an impedance point at which the electric power is maximized.

For example, in the amplifier that operates corresponding to the plural frequency bands, in both the frequency of the frequency band f1 and the frequency band f2, it may be difficult to achieve a matching circuit that can ensure the impedance matching so that the efficiency is optimized in some cases. In this case, the design is made such that the matching can be ensured to optimize the efficiency in the frequency band f1 and the matching can be ensured to maximize the electric power in the frequency band f2. The impedance matching point at which the efficiency is optimized may be different from the impedance matching point at which the electric power is maximized. In the amplifier 308, since the two types of impedance points can be selected, it is possible to increase the impedance points that can be selected at the time of designing.

Figure 6:
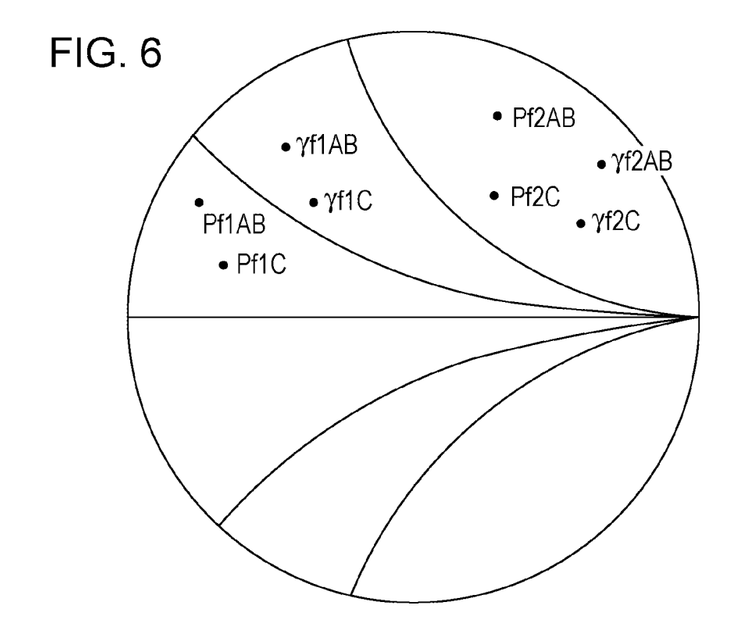
FIG. 6 is a Smith chart illustrating an example of an impedance matching by output matching circuits.

FIG. 6 is a Smith chart illustrating an example of an impedance matching by the output matching circuits $406_1$ and $406_2$.

In FIG. 6, "Pf1AB" is a point representing the impedance where the electric power is maximized when the input signal in the frequency band f1 is amplified by the amplification element that receives the bias voltage to operate in Class AB. "Pf1C" is a point representing the impedance where the electric power is maximized when the input signal in the frequency band f1 is amplified by the amplification element that receives the bias voltage to operate in Class C. "γf1AB" is a point representing the impedance where the efficiency is optimized when the input signal in the frequency band f1 is amplified by the amplification element that receives the bias voltage to operate in Class AB. "γf1C" is a point representing the impedance where the efficiency is optimized when the input signal in the frequency band f1 is amplified by the amplification element that receives the bias voltage to operate in Class C.

Further, "Pf2AB" is a point representing the impedance where the electric power is maximized when the input signal in the frequency band f2 is amplified by the amplification element that receives the bias voltage to operate in Class AB. "Pf2C" is a point representing the impedance where the electric power is maximized when the input signal in the frequency band f2 is amplified by the amplification element that receives the bias voltage to operate in Class C. "γf2AB" is a point representing the impedance where the efficiency is optimized when the input signal in the frequency band f2 is amplified by the amplification element that receives the bias voltage to operate in Class AB. "γf2C" is a point representing the impedance where the efficiency is optimized when the input signal in the frequency band f2 is amplified by the amplification element that receives the bias voltage to operate in Class C.

In the example illustrated in FIG. 6, "Pf1AB" as the impedance matching point at which the electric power is maximized in the frequency band f1 or "γf1AB" as the impedance matching point at which the efficiency is optimized in the frequency band f1 can be set in the output matching circuit $406_1$. Furthermore, in accordance with the impedance matching point set in the output matching circuit $406_1$, it is possible to set the impedance matching point in the output matching circuit $406_2$. More specifically, "γf1C" as the impedance matching point at which the efficiency is optimized in the frequency band f1 or "Pf1C" as the impedance matching point at which the electric power is maximized in the frequency band f1 can be set in the output matching circuit $406_2$.

Further, "Pf2AB" as the impedance matching point at which the electric power is maximized in the frequency band f2 or "γf2AB" as the impedance matching point at which the efficiency is optimized in the frequency band f2 can be set in the output matching circuit $406_1$. Furthermore, in accordance with the impedance matching point set in the output matching circuit $406_1$, it is possible to set the impedance matching point in the output matching circuit $406_2$. More specifically, "γf2C" as the impedance matching point at which the efficiency is optimized in the frequency band f2 or "Pf2C" as the impedance matching point at which the electric power is maximized in the frequency band f2 can be set in the output matching circuit $406_2$. Accordingly, when the multiband of the amplifier is to be achieved, it is possible to improve the degree of freedom in the design of the matching circuit.

<Operation by the Amplifier 308>

Figure 7:
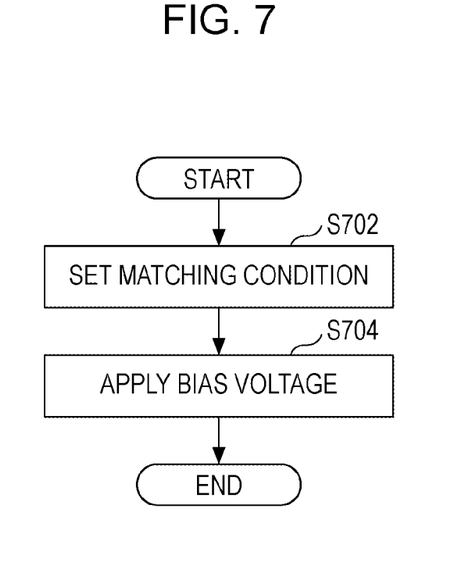
FIG. 7 is a flowchart of an operation by the amplifier according to the first embodiment.

FIG. 7 is a flowchart of an operation by the amplifier 308 according to the embodiment. Herein, a case where the switching is conducted so that the signal in the 700 MHz band is amplified and a case where the switching is conducted so that the signal in the 2.1 GHz band is amplified will be described.

<Case where Switching is Conducted so that Signal in 700 MHz band is Amplified>

The switching is conducted to cause the amplifier 308 that has been set to amplify the signal in the 2.1 GHz band to amplify the signal in the 700 MHz band.

The matching condition is set in the amplifier 308 (step S702). More specifically, in the input matching circuit $402_1$, the impedance matching point at which the efficiency is optimized at 700 MHz is set. Also, in the output matching circuit $406_1$, the impedance matching point at which the efficiency is optimized at 700 MHz is set.

On the other hand, in the input matching circuit $402_2$, the impedance matching point at which the electric power is maximized at 700 MHz is set. Also, in the output matching circuit $406_2$, the impedance matching point at which the electric power is maximized at 700 MHz is set.

The bias voltage is applied to the amplifier 308 (step S704). More specifically, the amplification element $404_1$ receives the bias voltage to operate in Class AB. On the other hand, the amplification element $404_2$ receives the bias voltage to operate in Class C.

<Case where Switching is Conducted so that Signal in 2.1 GHz Band is Amplified>

The switching is conducted to cause the amplifier 308 that has been set to amplify the signal in the 700 MHz band to amplify the signal in the 2.1 GHz band.

The matching condition is set in the amplifier 308 (step S702). More specifically, in the input matching circuit $402_1$, the impedance matching point at which the electric power is maximized at 2.1 GHz is set. Also, in the output matching circuit $406_1$, the impedance matching point at which the electric power is maximized at 2.1 GHz is set.

On the other hand, in the input matching circuit $402_2$, the impedance matching point at which the efficiency is optimized at 2.1 GHz is set. Also, in the output matching circuit $406_2$, the impedance matching point at which the efficiency is optimized at 2.1 GHz is set.

The bias voltage is applied to the amplifier 308 (step S704). More specifically, the amplification element $404_1$ receives the bias voltage to operate in Class C. On the other hand, the amplification element $404_2$ receives the bias voltage to operate in Class AB.

According to the present embodiment, when the multiband of the Doherty amplifier is to be achieved, it is possible to improve the degree of freedom in the design of the matching circuit. That is, it is possible to select the impedance matching point to be set from the plural impedance matching points. Since the impedance matching point can be selected from the plural impedance matching points, it is possible to easily achieve the multiband of the Doherty amplifier. Also, without switching the transmission lines or the like, it is possible to achieve the multiband of the Doherty amplifier.

Further, in the amplifier that operates corresponding to the 700 MHz band and the 2.1 GHz band, as described above, the transmission lines 408 and 410 can be achieved by the lines of λ/4.

In the Doherty amplifier, the signal from the carrier-amplifier and the signal from the peak-amplifier are to be coupled to each other at a phase difference of 90 degrees. In the amplifier 308 illustrated in FIG. 4, the signal from the carrier-amplifier and the signal from the peak-amplifier can be coupled to each other at the phase difference of 90 degrees by the transmission line 408.

Further, at the time of the operation by the peak-amplifier, since the carrier-amplifier and the peak-amplifier are operated in parallel, the impedance conversion is to be conducted on the signal obtained by synthesizing the signal from the peak-amplifier with the signal from the carrier-amplifier. In the amplifier 308 illustrated in FIG. 4, the impedance conversion is conducted by the transmission line 410 on the signal obtained by synthesizing the signal from the peak-amplifier with the signal from the carrier-amplifier.

For example, the transmission lines 408 and 410 can be replaced by lines of 90 degrees (λ/4). However, since the line has a frequency characteristic, a case of a certain frequency corresponds to the phase of 90 degrees.

According to the present embodiment, the amplifier 308 is set to correspond to the 700 MHz band and the 2.1 GHz band that is three times as high as 700 MHz. With the settings for corresponding to the 700 MHz band and the 2.1 GHz band, the transmission lines 408 and 410 can be used in common with the λ/4 line at the low frequency, that is, 700 MHz. Since the transmission lines can be used in common with the λ/4 line at 700 MHz, it is possible to avoid the switching of the line on the output side.

Second Embodiment

<Base Station>

The base station 100 and the base station 200 according to a second embodiment are similar to those in FIG. 1 and FIG. 2.

<Transmission Unit 300>

Figure 8:
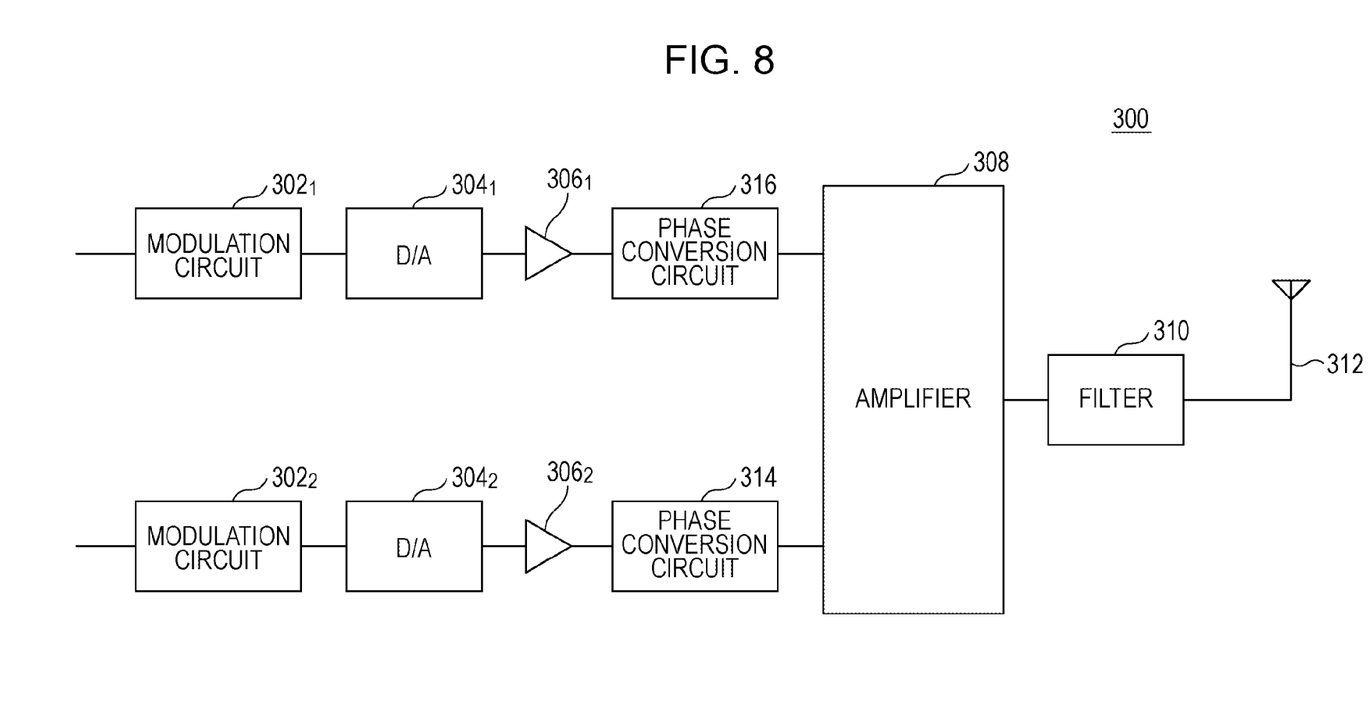
FIG. 8 illustrates a transmission unit according to a second embodiment.

FIG. 8 illustrates the transmission unit 300 according to the second embodiment. The transmission unit 300 according to the second embodiment is different from the transmission unit described with reference to FIG. 3 in that the transmission unit 300 according to the second embodiment includes a phase conversion circuit 316.

The phase conversion circuit 316 is connected to the preamplifier $306_1$. The phase conversion circuit 316 shifts the phase of the signal from the preamplifier $306_1$. The phase conversion circuit 316 sends out the signal from the preamplifier $306_1$ the phase of which is shifted to the amplifier 308. More specifically, the phase conversion circuit 316 delays the phase of the signal from the preamplifier $306_1$.

Further, the phase conversion circuit 314 adds 90 degrees and more to shift the phase of the signal from the preamplifier $306_2$. The phase conversion circuit 314 sends out the signal from the preamplifier $306_2$ the phase of which is shifted by being added with 90 degrees and more to the amplifier 308. More specifically, the phase conversion circuit 316 shifts the phase of the signal from the preamplifier $306_1$ by 90 degrees and further delays the phase.

<Amplifier 308>

Figure 9:
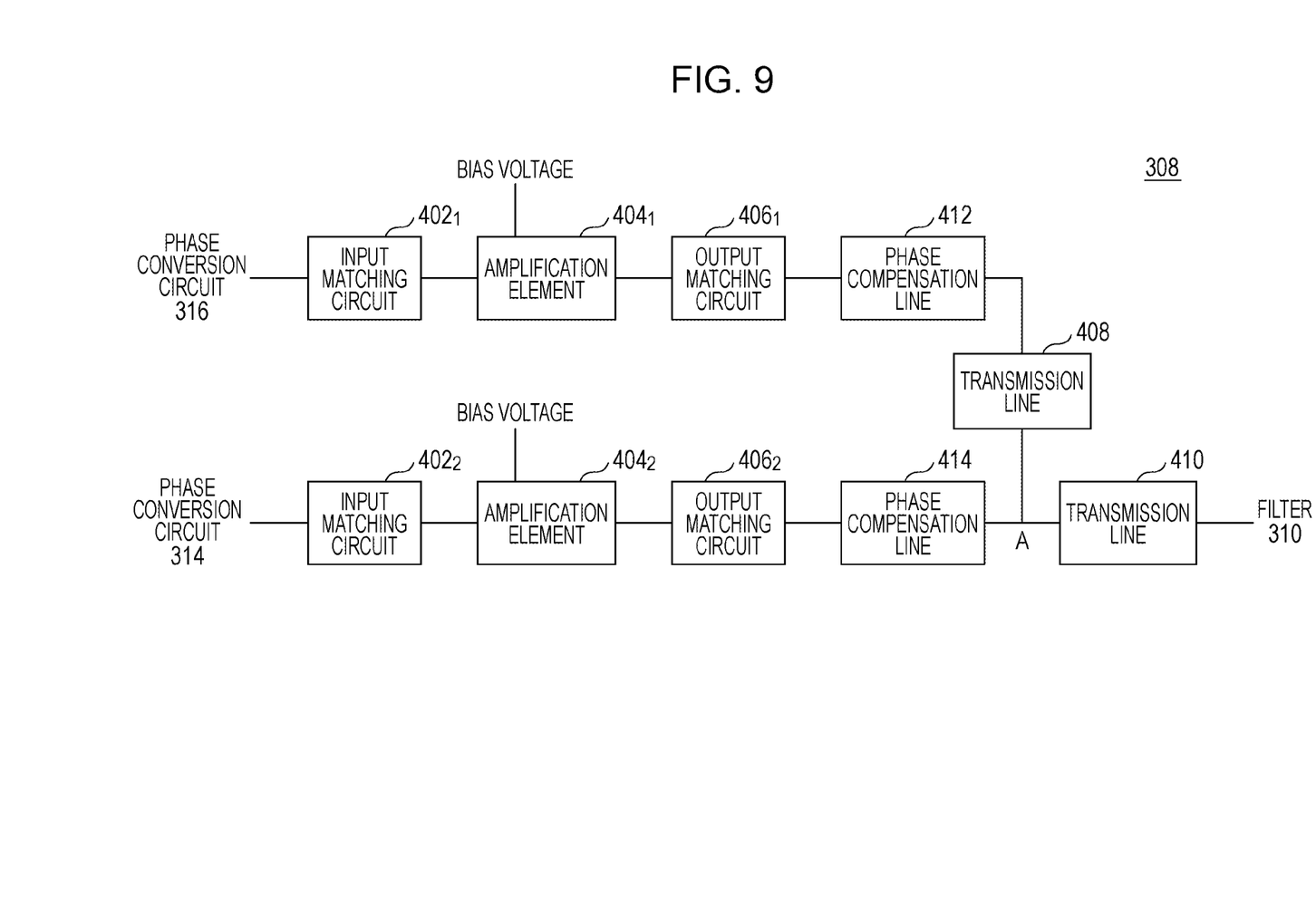
FIG. 9 illustrates an amplifier according to the second embodiment.

FIG. 9 illustrates the amplifier 308 according to the embodiment. The amplifier 308 according to the second embodiment is different from the amplifier 308 described with reference to FIG. 4 in that the amplifier 308 according to the second embodiment includes phase compensation lines 412 and 414.

A signal from the phase conversion circuit 316 is input to the input matching circuit $402_1$.

The phase compensation line 412 is connected to the output matching circuit $406_1$. The phase compensation line 412 is a transmission line configured to compensate for a shift of the phase generated by the amplification element $404_1$.

Specifically, in a case where the signal in the 700 MHz band is amplified, the phase compensation line 412 compensates the signal from the output matching circuit $406_1$ by a phase $\theta_1$. The phase $\theta_1$ is a shift of the phase supposed to be generated by the amplification element $404_1$ when the signal in the 700 MHz band is amplified. The signal the phase of which is compensated by the phase compensation line 412 is input to the transmission line 408.

Further, in a case where the signal in the 2.1 GHz band is amplified, the phase compensation line 412 compensates the signal from the output matching circuit $406_1$ by a phase $\theta_3$. The phase $\theta_3$ is a shift of the phase supposed to be generated by the amplification element $404_1$ when the signal in the 2.1 GHz band is amplified. The signal the phase of which is compensated by the phase compensation line 412 is input to the transmission line 408.

The phase compensation line 414 is connected to the output matching circuit $406_2$. The phase compensation line 414 is a transmission line configured to compensate for a shift of the phase generated by the amplification element $404_2$.

Specifically, in a case where the signal in the 700 MHz band is amplified, the phase compensation line 414 compensates the signal from the output matching circuit $406_2$ by a phase $\theta_2$. The phase $\theta_2$ is a shift of the phase supposed to be generated by the amplification element $404_2$ when the signal in the 700 MHz band is amplified. The signal the phase of which is compensated by the phase compensation line 414 is synthesized with the signal from the transmission line 408 at the coupling part A to be input to the transmission line 410.

Further, in a case where the signal in the 2.1 GHz band is amplified, the phase compensation line 414 compensates the signal from the output matching circuit $406_2$ by a phase $\theta_4$. The phase $\theta_4$ is a shift of the phase supposed to be generated by the amplification element $404_2$ when the signal in the 2.1 GHz band is amplified. The signal the phase of which is compensated by the phase compensation line 414 is synthesized with the signal from the transmission line 408 at the coupling part A to be input to the transmission line 410.

In the Doherty amplifier, the signal from the carrier-amplifier and the signal from the peak-amplifier are to be coupled to each other at a phase difference of 90 degrees. However, since the bias conditions and the matching conditions vary between the carrier-amplifier and the peak-amplifier, the signal that is output from the carrier-amplifier and the signal that is output from the peak-amplifier do not have a same passing phase. Accordingly, on the output side of the output matching circuits $406_1$ and $406_2$, the phase compensation lines 412 and 414 are respectively provided, so that the lines configured to compensate the passing phase are inserted.

However, if the frequency for achieving the multiband is changed, the phase shift amounts are not the same. To compensate for the phase shift amounts supposed to fluctuate in response to the change in the frequency, the phase shift amounts are individually set in the carrier-amplifier and the peak-amplifier.

More specifically, in a case where the signal in the 700 MHz band is amplified, the phase conversion circuit 316 sets an amount of shifting the phase of the signal from the preamplifier $306_1$ as $\Delta\theta_1$, and the phase conversion circuit 314 sets an amount of shifting the phase of the signal from the preamplifier $306_2$ as $\Delta\theta_2$.

Further, in a case where the signal in the 2.1 GHz band is amplified, the phase conversion circuit 316 sets an amount of shifting the phase of the signal from the preamplifier $306_1$ as $\Delta\theta_3$, and the phase conversion circuit 314 sets an amount of shifting the phase of the signal from the preamplifier $306_2$ as $\Delta\theta_4$.

With this configuration, for achieving the multiband, even in a case where the frequency of the input signal is changed, it is possible to compensate for the phase shift amount that fluctuates when the frequency is changed.

<Operation by the Amplifier 308>

Figure 10:
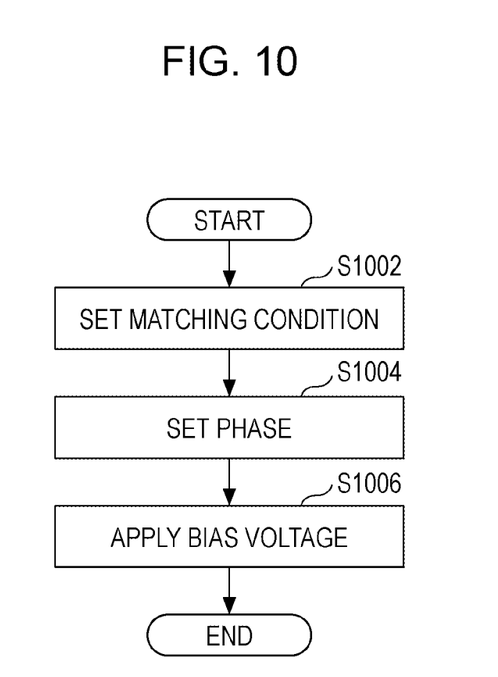
FIG. 10 is a flowchart of an operation by the amplifier according to the second embodiment.

FIG. 10 is a flowchart of an operation by the amplifier 308 according to the embodiment. Herein, a case will be described where the switching is conducted so that the signal in the 700 MHz band is amplified and a case will be described where the switching is conducted so that the signal in the 2.1 GHz band is amplified.

<Case where Switching is Conducted so that Signal in 700 MHz Band is Amplified>

The switching is conducted to cause the amplifier 308 that has been set to amplify the signal in the 2.1 GHz band to amplify the signal in the 700 MHz band.

The matching condition is set in the amplifier 308 (step S1002). Specifically, in the input matching circuit $402_1$, the impedance matching point at which the efficiency is optimized at 700 MHz is set. Also, in the output matching circuit $406_1$, the impedance matching point at which the efficiency is optimized at 700 MHz is set.

On the other hand, in the input matching circuit $402_2$, the impedance matching point at which the electric power is maximized at 700 MHz is set. Also, in the output matching circuit $406_2$, the impedance matching point at which the electric power is maximized at 700 MHz is set.

The phase is set (step S1004). More specifically, $\Delta\theta_1$ is set as the phase shift amount in the phase conversion circuit 316, and $\Delta\theta_2$ is set as the phase shift amount in the phase conversion circuit 314. Also, the phase compensation line 412 is set to compensate the phase of the signal from the output matching circuit $406_1$ by the phase $\theta_1$. Also, the phase compensation line 414 is set to compensate the phase of the signal from the output matching circuit $406_2$ by the phase $\theta_2$.

The bias voltage is applied to the amplifier 308 (step S1006). More specifically, the amplification element $404_1$ receives the bias voltage to operate in Class AB. On the other hand, the amplification element $404_2$ receives the bias voltage to operate in Class C.

<Case where Switching is Conducted so that Signal in 2.1 GHz Band is Amplified>

The switching is conducted to cause the amplifier 308 that has been set to amplify the signal in the 700 MHz band to amplify the signal in the 2.1 GHz band.

The matching condition is set in the amplifier 308 (step S1002). More specifically, in the input matching circuit $402_1$, the impedance matching point at which the electric power is maximized at 2.1 GHz is set. Also, in the output matching circuit $406_1$, the impedance matching point at which the electric power is maximized at 2.1 GHz is set.

On the other hand, in the input matching circuit $402_2$, the impedance matching point at which the efficiency is optimized at 2.1 GHz is set. Also, in the output matching circuit $406_2$, the impedance matching point at which the efficiency is optimized at 2.1 GHz is set.

The phase is set (step S1004). More specifically, $\Delta\theta_3$ is set as the phase shift amount in the phase conversion circuit 316, and $\Delta\theta_4$ is set as the phase shift amount in the phase conversion circuit 314. Also, the phase compensation line 412 is set to compensate the phase of the signal from the output matching circuit $406_1$ by the phase $\theta_3$. The phase compensation line 414 is set to compensate the phase of the signal from the output matching circuit $406_2$ by the phase $\theta_4$.

The bias voltage is applied to the amplifier 308 (step S1006). More specifically, the amplification element $404_1$ receives the bias voltage to operate in Class C. On the other hand, the amplification element $404_2$ receives the bias voltage to operate in Class AB.

According to the present embodiment, when the multiband of the Doherty amplifier is to be achieved, it is possible to improve the degree of freedom in the design of the matching circuit. That is, it is possible to select the impedance matching point to be set from the plural impedance matching points. Since the impedance matching point can be selected from the plural impedance matching points, it is possible to easily achieve the multiband of the Doherty amplifier. Also, without switching the transmission lines or the like, it is possible to achieve the multiband of the Doherty amplifier.

Further, in the amplifier that operates corresponding to the 700 MHz band and the 2.1 GHz band, as described above, the transmission lines 408 and 410 can be achieved by the lines of $\lambda/4$.

In the Doherty amplifier, the signal from the carrier-amplifier and the signal from the peak-amplifier are to be coupled to each other at a phase difference of 90 degrees. In the amplifier 308 illustrated in FIG. 9, the signal from the carrier-amplifier and the signal from the peak-amplifier can be coupled to each other at the phase difference of 90 degrees by the transmission line 408.

Further, at the time of the operation by the peak-amplifier, since the carrier-amplifier and the peak-amplifier are operated in parallel, the impedance conversion is to be conducted on the signal obtained by synthesizing the signal from the peak-amplifier with the signal from the carrier-amplifier. In the amplifier 308 illustrated in FIG. 9, the impedance conversion is conducted by the transmission line 410 on the signal obtained by synthesizing the signal from the peak-amplifier with the signal from the carrier-amplifier.

For example, the transmission lines 408 and 410 can be replaced by lines of 90 degrees ($\lambda/4$). However, since the line has a frequency characteristic, a case of a certain frequency corresponds to the phase of 90 degrees.

According to the present embodiment, the amplifier 308 is set to correspond to the 700 MHz band and the 2.1 GHz band that is three times as high as 700 MHz. With the setting for corresponding to the 700 MHz band and the 2.1 GHz band, the transmission lines 408 and 410 can be used in common with the $\lambda/4$ line at the low frequency, that is, 700 MHz. Since the transmission lines can be used in common with the $\lambda/4$ line at 700 MHz, it is possible to avoid the switching of the line on the output side.

Further, according to the present embodiment, since the shift of the passing phases between the signal from the carrier-amplifier and the signal from the peak-amplifier can be compensated for, the shifts of the synthesis points between the signal from the carrier-amplifier and the signal from the peak-amplifier can be reduced. Since the shifts of the synthesis points between the signal from the carrier-amplifier and the signal from the peak-amplifier can be reduced, it is possible to improve the amplification characteristic at a time when the maximum power is obtained, in particular.

Further, without carrying out the physical switching of the lines or the like when the frequency bands are switched, it is possible to adjust the shift of the phase generated by the frequency characteristic that is different for each amplification element by controlling the phase of the input signal.

According to the above-mentioned embodiment, the operation classes of the amplification elements $404_1$ and $404_2$ may be switched between Class AB and Class B and may also be switched between Class A and Class B. Also, the operation classes of the amplification elements $404_1$ and $404_2$ may be switched between Class AB and Class C and may also be switched between Class A and Class C.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifier comprising:
a first amplification element configured to amplify a first signal in one of a first operation class and a second operation class;
a second amplification element configured to amplify a second signal in one of a first operation class and a second operation class;
a first transmission line through which the amplified first signal is transferred; and
a coupler configured to couple the first signal transferred through the first transmission line and the amplified second signal so as to transfer the coupled signal to a second transmission line,
wherein the first amplification element amplifies the first signal in the first operation class and the second amplification element amplifies the second signal in the second operation class, when the first signal and the second signal have a first frequency band, and
wherein the first amplification element amplifies the first signal in the second operation class and the second amplification element amplifies the second signal in the first operation class, when the first signal and the second signal have a second frequency band.

2. The amplifier according to claim 1, further comprising:
a first input matching circuit configured to match an input impedance of the first amplification element and an output impedance of a device from which the first signal is transferred;
a first output matching circuit configured to match an output impedance of the first amplification element and an impedance of the first transmission line;
a second input matching circuit configured to match an input impedance of the second amplification element and an output impedance of a device from which the second signal is transferred; and
a second output matching circuit configured to match an output impedance of the second amplification element and an impedance of the second transmission line,
wherein the first input matching circuit and the first output matching circuit match the impedances in accordance with a matching condition putting a priority on an amplification efficiency, and the second input matching circuit and the second output matching circuit match the impedances in accordance with a matching condition putting a priority on output power, when the first signal and the second signal have the first frequency band, and
wherein the first input matching circuit and the first output matching circuit match the impedances in accordance with the matching condition putting the priority on the output power, and the second input matching circuit and the second output matching circuit match the impedances in accordance with the matching condition putting the priority on the amplification efficiency, when the first signal and the second signal have the second frequency band.

3. The amplifier according to claim 2,
wherein the first amplification element amplifies the first signal in the first operation class as a peak-amplifier of Doherty amplifier and the second amplification element amplifies the second signal in the second operation class as a carrier-amplifier of Doherty amplifier, when the first signal and the second signal have the first frequency band, and wherein the first amplification element amplifies the first signal in the second operation class as the carrier-amplifier of Doherty amplifier and the second amplification element amplifies the second signal in the second operation class as the peak-amplifier of Doherty amplifier, when the first signal and the second signal have the second frequency band, when the first signal and the second signal have the second frequency band.

4. The amplifier according to claim 2, wherein each of the matching condition putting the priority on the amplification efficiency and the matching condition putting the priority on the output power amplification efficiency is set in advance based on the first and second frequency bands and the first and second operation classes of the first and second amplification elements.

5. The amplifier according to claim 1,
wherein the first amplification element amplifies the first signal in the first operation class as a peak-amplifier of Doherty amplifier and the second amplification element amplifies the second signal in the second operation class as a carrier-amplifier of Doherty amplifier, when the first signal and the second signal have the first frequency band, and wherein the first amplification element amplifies the first signal in the second operation class as the carrier-amplifier of Doherty amplifier and the second amplification element amplifies the second signal in the second operation class as the peak-amplifier of Doherty amplifier, when the first signal and the second signal have the second frequency band, when the first signal and the second signal have the second frequency band.

6. The amplifier according to claim 1, further comprising:
a first phase compensation line configured to compensate for a phase shift generated by the first amplification element; and
a second phase compensation line configured to compensate for a phase shift generated by the second amplification element.

7. The amplifier according to claim 1,
wherein the first signal input to the first amplification element is a signal in which a phase shift generated when the first signal having one of the first and second frequency bands is amplified by the first amplification element is compensated, and
wherein the second signal input to the second amplification element is a signal in which a phase shift generated when the second signal having one of the first and second frequency bands is amplified by the second amplification element is compensated.

8. The amplifier according to claim 1,
wherein the second frequency band is three times as high as the first frequency band, and
wherein the first transmission line has an electric length corresponding to the first frequency band.

9. The amplifier according to claim 1, wherein the second signal input to the second amplification element has a phase delay by 90 degrees with respect to the first signal input to the first amplification element.

10. The amplifier according to claim 1, wherein the first operation class is Class A or Class AB, and the second operation class is Class B or Class C.

11. A transmission unit comprising:
a first amplification element configured to amplify a first signal in one of a first operation class and a second operation class;
a second amplification element configured to amplify a second signal in one of a first operation class and a second operation class;
a phase conversion circuit configured to shift a phase of the second signal input to the second amplification element;
a first transmission line through which the amplified first signal is transferred; and
a coupler configured to couple the first signal transferred through the first transmission line and the amplified second signal so as to transfer the coupled signal to a second transmission line,
wherein the first amplification element amplifies the first signal in the first operation class and the second amplification element amplifies the second signal in the second operation class, when the first signal and the second signal have a first frequency band, and
wherein the first amplification element amplifies the first signal in the second operation class and the second amplification element amplifies the second signal in the first operation class, when the first signal and the second signal have a second frequency band.

12. A base station comprising:
a transmission unit, the transmission unit comprising:
a first amplification element configured to amplify a first signal in one of a first operation class and a second operation class;
a second amplification element configured to amplify a second signal in one of a first operation class and a second operation class;
a phase conversion circuit configured to shift a phase of the second signal input to the second amplification element;
a first transmission line through which the amplified first signal is transferred; and
a coupler configured to couple the first signal transferred through the first transmission line and the amplified second signal so as to transfer the coupled signal to a second transmission line,
wherein the first amplification element amplifies the first signal in the first operation class and the second amplification element amplifies the second signal in the second operation class, when the first signal and the second signal have a first frequency band, and
wherein the first amplification element amplifies the first signal in the second operation class and the second amplification element amplifies the second signal in the first operation class, when the first signal and the second signal have a second frequency band.

* * * * *